(12) United States Patent
Chi et al.

(10) Patent No.: US 9,379,881 B1
(45) Date of Patent: Jun. 28, 2016

(54) PHASE INTERPOLATOR CIRCUIT, CLOCK DATA RECOVERY CIRCUIT INCLUDING THE SAME, AND PHASE INTERPOLATION METHOD

(71) Applicant: SK hynix Inc., Gyeonggi-do (KR)

(72) Inventors: Han-Kyu Chi, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/749,342

(22) Filed: Jun. 24, 2015

(30) Foreign Application Priority Data

Mar. 18, 2015  (KR) ........................ 10-2015-0037227

(51) Int. Cl.
*H04L 27/00*   (2006.01)
*H04L 7/00*    (2006.01)
*H03K 5/135*   (2006.01)
*H03K 5/00*    (2006.01)

(52) U.S. Cl.
CPC .............. *H04L 7/0025* (2013.01); *H03K 5/135* (2013.01); *H04L 7/0008* (2013.01); *H03K 2005/00052* (2013.01)

(58) Field of Classification Search
CPC ............................ H04L 7/033; H04L 7/0337
USPC ......................................... 375/373, 354, 371
See application file for complete search history.

(56) References Cited

U.S. PATENT DOCUMENTS

| | | | |
|---|---|---|---|
| 6,901,126 B1* | 5/2005 | Gu ............................... | 375/355 |
| 7,432,750 B1* | 10/2008 | Sidiropoulos et al. ........ | 327/156 |
| 8,248,138 B2 | 8/2012 | Liu | |
| 2004/0252804 A1* | 12/2004 | Aoyama ....................... | 375/376 |
| 2007/0147564 A1* | 6/2007 | Fan et al. ...................... | 375/355 |

FOREIGN PATENT DOCUMENTS

KR       100378202        3/2003
KR  WO 2004032407 A1 *   4/2004

OTHER PUBLICATIONS

Hidaka, Y., et al., A 4-Channel 3.1/10.3Gb/s Transceiver Macro with a Pattern-Tolerant Adaptive Equalizer, 2007 IEEE Solid-State Circuits Conference, pp. 442-443.

* cited by examiner

*Primary Examiner* — Shuwang Liu
*Assistant Examiner* — Helene Tayong
(74) *Attorney, Agent, or Firm* — IP&T Group LLP

(57) ABSTRACT

A phase interpolator circuit that includes an interpolator suitable for generating synthesized clocks through synthesizing two multi-phase clocks; and an interpolation code generator suitable for generating an interpolation code for controlling the interpolator in response to a shift request. The interpolation code generator generates the interpolation code so that a (K+1)-th multi-phase clock is output as the synthesized clock when a phase of the synthesized clock is to be changed from a phase between K-th and (K+1)-th multi-phase clocks to a phase between (K+1)-th and (K+2)-th multi-phase clocks in response to a multi-shift-up request.

17 Claims, 7 Drawing Sheets

FIG. 4

| CODE<5> | CODE<4> | CODE<3> | SEL_CLK0 | SEL_CLK1 |
|---|---|---|---|---|
| 0 | 0 | 0 | CLKIN0 | CLKIN1 |
| 0 | 0 | 1 | CLKIN2 | CLKIN1 |
| 0 | 1 | 0 | CLKIN2 | CLKIN3 |
| 0 | 1 | 1 | CLKIN4 | CLKIN3 |
| 1 | 0 | 0 | CLKIN4 | CLKIN5 |
| 1 | 0 | 1 | CLKIN6 | CLKIN5 |
| 1 | 1 | 0 | CLKIN6 | CLKIN7 |
| 1 | 1 | 1 | CLKIN0 | CLKIN7 |

FIG. 5

| CODE<2> | CODE<1> | CODE<0> | SYNTHESIS RATIO | |
|---|---|---|---|---|
| | | | SEL_CLK0 | SEL_CLK1 |
| 0 | 0 | 0 | 4 | 0 |
| 0 | 0 | 1 | 3 | 1 |
| 0 | 1 | 0 | 2 | 2 |
| 0 | 1 | 1 | 1 | 3 |
| 1 | 0 | 0 | 0 | 4 |

FIG. 6

| CODE<5> | CODE<4> | CODE<3> | CODE<2> | CODE<1> | CODE<0> | CLK_OUT |
|---|---|---|---|---|---|---|
| 0 | 1 | 1 | 0 | 0 | 0 | CLK0 |
| 0 | 0 | 0 | 0 | 0 | 0 | CLK0 |
| 0 | 0 | 0 | 0 | 0 | 1 | CLK1 |
| 0 | 0 | 0 | 0 | 1 | 0 | CLK2 |
| 0 | 0 | 0 | 0 | 1 | 1 | CLK3 |
| 0 | 0 | 0 | 1 | 0 | 0 | CLK4 |
| 0 | 0 | 1 | 1 | 0 | 0 | CLK4 |
| 0 | 0 | 1 | 0 | 1 | 1 | CLK5 |
| 0 | 0 | 1 | 0 | 1 | 0 | CLK6 |
| 0 | 0 | 1 | 0 | 0 | 1 | CLK7 |
| 0 | 0 | 1 | 0 | 0 | 0 | CLK8 |
| 0 | 1 | 0 | 0 | 0 | 0 | CLK8 |
| 0 | 1 | 0 | 0 | 0 | 1 | CLK9 |
| 0 | 1 | 0 | 0 | 1 | 0 | CLK10 |
| 0 | 1 | 0 | 0 | 1 | 1 | CLK11 |
| 0 | 1 | 0 | 1 | 0 | 0 | CLK12 |
| 0 | 1 | 1 | 1 | 0 | 0 | CLK12 |
| 0 | 1 | 1 | 0 | 1 | 1 | CLK13 |
| 0 | 1 | 1 | 0 | 1 | 0 | CLK14 |
| 0 | 1 | 1 | 0 | 0 | 1 | CLK15 |
| 0 | 1 | 1 | 0 | 0 | 0 | CLK16 |
| 1 | 0 | 0 | 0 | 0 | 0 | CLK16 |
| 1 | 0 | 0 | 0 | 0 | 1 | CLK17 |
| 1 | 0 | 0 | 0 | 1 | 0 | CLK18 |
| 1 | 0 | 0 | 0 | 1 | 1 | CLK19 |
| 1 | 0 | 0 | 1 | 0 | 0 | CLK20 |
| 1 | 0 | 1 | 1 | 0 | 0 | CLK20 |
| 1 | 0 | 1 | 0 | 1 | 1 | CLK21 |
| 1 | 0 | 1 | 0 | 1 | 0 | CLK22 |
| 1 | 0 | 1 | 0 | 0 | 1 | CLK23 |
| 1 | 0 | 1 | 0 | 0 | 0 | CLK24 |
| 1 | 1 | 0 | 0 | 0 | 0 | CLK24 |
| 1 | 1 | 0 | 0 | 0 | 1 | CLK25 |
| 1 | 1 | 0 | 0 | 1 | 0 | CLK26 |
| 1 | 1 | 0 | 0 | 1 | 1 | CLK27 |
| 1 | 1 | 0 | 1 | 0 | 0 | CLK28 |
| 1 | 1 | 1 | 1 | 0 | 0 | CLK28 |
| 1 | 1 | 1 | 0 | 1 | 1 | CLK29 |
| 1 | 1 | 1 | 0 | 1 | 0 | CLK30 |
| 1 | 1 | 1 | 0 | 0 | 1 | CLK31 |

PHASE INTERPOLATOR CIRCUIT, CLOCK DATA RECOVERY CIRCUIT INCLUDING THE SAME, AND PHASE INTERPOLATION METHOD

CROSS-REFERENCE TO RELATED APPLICATIONS

The present application claims priority of Korean Patent Application No. 10-2015-0037227, filed on Mar. 18, 2015, which is incorporated herein by reference in its entirety.

BACKGROUND

1. Field

Exemplary embodiments of the present invention relate to a phase interpolator circuit.

2. Description of the Related Art

A phase interpolator circuit generates clocks having various phases for various integrated circuits. The phase interpolator circuit receives clocks having different phases, and generates an output clock having one of the phases of the received clocks after synthesis. Since the phase interpolator circuit can be implemented by a simple circuit and can generate an output clock having a precisely desired phase, it is used in various application circuits.

SUMMARY

Various embodiments of the present invention are directed to a phase interpolator circuit that prevents glitches.

In an embodiment, a phase interpolator circuit includes an interpolator suitable for generating synthesized clocks through synthesizing two multi-phase clocks that are selected from first to N-th multi-phase clocks, wherein N is an integer greater than or equal to 3; and an interpolation code generator suitable for generating an interpolation code for controlling the interpolator in response to a shift-up request, a shift-down request, a multi-shift-up request, and a multi-shift-down request, wherein the interpolation code generator generates the interpolation code so that a (K+1)-th multi-phase clock is output as the synthesized clock when a phase of the synthesized clock should be changed from a phase between K-th and (K+1)-th multi-phase clocks to a phase between (K+1)-th and (K+2)-th multi-phase clocks in response to the multi-shift-up request, wherein K is an integer greater than or equal to 1 and less than or equal to N, in the case of K-th being N-th, (K+1)-th is first, and in the case of K-th being first, (K−1)-th is N-th.

The interpolation code generator may further generate the interpolation code so that the K-th multi-phase clock is output as the synthesized clock when the phase of the synthesized clock should be changed from the phase between the K-th and (K+1)-th multi-phase clocks to a phase between (K−1)-th and K-th multi-phase clocks in response to the multi-shift-down request.

The interpolator may include a clock selector suitable for selecting the two multi-phase clocks from the first to N-th multi-phase clocks in response to first bits of the interpolation code; and a clock mixer suitable for generating the synthesized clocks through synthesizing the two multi-phase clocks that are selected by the clock selector at a synthesis ratio that is determined by second bits of the interpolation code.

The interpolation code generator may include a preliminary interpolation code generator suitable for increasing by one step a preliminary interpolation code in response to the shift-up request, for increasing by two steps the preliminary interpolation code in response to the multi-shift-up request, for decreasing by one step the preliminary interpolation code in response to the shift-down request, and for decreasing by two steps the preliminary interpolation code in response to the multi-shift-down request; and a code correction unit suitable for decreasing by one step the preliminary interpolation code and outputting the decreased preliminary interpolation code as the interpolation code when the phase of the synthesized clock should be changed from the phase between the K-th and (K+1)-th multi-phase clocks to the phase between the (K+1)-th and (K+2)-th multi-phase clocks in response to the multi-shift-up request, for increasing by one step the preliminary interpolation code and to output the increased preliminary interpolation code as the interpolation code when the phase of the synthesized clock should be changed from the phase between the K-th and (K+1)-th multi-phase clocks to the phase between (K−1)-th and K-th multi-phase clocks in response to the multi-shift-down request, and outputting the preliminary interpolation code as the interpolation code otherwise.

In an embodiment, a phase interpolation method includes selecting two multi-phase clocks from first to N-th multi-phase clocks in response to first bits of an interpolation code, wherein N is an integer greater than or equal to 3; generating synthesized clocks through synthesizing the two multi-phase clocks at a synthesis ratio that is determined by second bits of the interpolation code; increasing by one step a preliminary interpolation code in response to a shift-up request; generating the interpolation code in the same manner as the preliminary interpolation code when the preliminary interpolation code is increased by one step; increasing by two steps the preliminary interpolation code in response to a multi-shift-up request; and generating the interpolation code by decreasing by one step the preliminary interpolation code when the preliminary interpolation code is increased by two steps and a phase of the synthesized clock is changed from a phase between K-th and (K+1)-th multi-phase clocks to a phase between (K+1)-th and (K+2)-th multi-phase clocks, wherein K is an integer that is greater than or equal to 1 and less than or equal to N, in the case of K-th being N-th, (K+1)-th is first, and in the case of K-th being first, (K−1)-th is N-th, and generating the interpolation code in the same manner as the preliminary interpolation code otherwise.

The phase interpolation method may further include decreasing by one step the preliminary interpolation code in response to a shift-down request; generating the interpolation code in the same manner as the preliminary interpolation code when the preliminary interpolation code is decreased by one step; decreasing by two steps the preliminary interpolation code in response to a multi-shift-down request; and generating the interpolation code by increasing by one step the preliminary interpolation code when the preliminary interpolation code is decreased by two steps, and the phase of the synthesized clock is changed from the phase between the K-th and (K+1)-th multi-phase clocks to a phase between (K−1)-th and K-th multi-phase clocks, and generating the interpolation code in the same manner as the preliminary interpolation code otherwise.

In an embodiment, a clock data recovery circuit includes a phase comparator suitable for comparing phases of received data and a recovered clock with each other; a request generator suitable for generating a shift-up request, a multi-shift-up request, a shift-down request, and a multi-shift-down request in response to the comparison result of the phase comparator; an interpolator suitable for generating synthesized clocks through synthesizing two multi-phase clocks that are selected from first to N-th multi-phase clocks, wherein N is an integer greater than or equal to 3; and an interpolation code generator suitable for generating an interpolation code for controlling the interpolator in response to the shift-up request, the shift-down request, the multi-shift-up request, and the multi-shift-down request, wherein the interpolation code generator generates the interpolation code so that the (K+1)-th multi-phase clock is output as the synthesized clock when a phase of the synthesized clock should be changed from a phase between K-th and (K+1)-th multi-phase clocks to a phase between (K+1)-th and (K+2)-th multi-phase clocks in response to the multi-shift-up request, wherein K is an integer greater than or equal to 1 and less than or equal to N, in the case of K-th being N-th, (K+1)-th is first, and in the case of K-th being first, (K−1)-th is N-th.

The interpolation code generator may further generate the interpolation code so that the K-th multi-phase clock is output as the synthesized clock when the phase of the synthesized clock should be changed from the phase between the K-th and (K+1)-th multi-phase clocks to a phase between (K−1)-th and K-th multi-phase clocks in response to the multi-shift-down request.

In an embodiment, a phase interpolator circuit may include: an interpolator suitable for generating a synthesized clock by synthesizing two selected from plural multi-phase clocks according to an interpolation code, wherein the selected multi-phase clocks form a phase region; and an interpolation code generator suitable for generating the interpolation code in response to a shift request, wherein the interpolation code generator adjusts the interpolation code in order to control the interpolator to generate the synthesized clock having a boundary phase between first and second phase regions when the shift request represents the synthesized clock shifting from one to the other between the first and second phase regions.

The shift request may either be multi-shift-up request or multi-shift-down request. The multi-shift-up request may represent shifting up the synthesized clock by two or more phase steps from a current phase. The multi-shift-down request may represent shifting down the synthesized clock by two or more phase steps from the current phase.

In an embodiment, a phase interpolation method may include: generating a synthesized clock by synthesizing two selected from plural multi-phase clocks according to an interpolation code, wherein the selected multi-phase clocks form a phase region; generating the interpolation code in response to a shift request; and adjusting the interpolation code in order to generate the synthesized clock having a boundary phase between first and second phase regions when the shift request represents the synthesized clock shifting from one to the other between the first and second phase regions.

In an embodiment, a clock data recovery circuit may include: a phase comparator suitable for comparing phases of received data and a recovered clock; a request generator suitable for generating a shift request according to the comparison result; an interpolator suitable for generating a synthesized clock by synthesizing two selected from plural multi-phase clocks according to an interpolation code, wherein the selected multi-phase clocks form a phase region; and an interpolation code generator suitable for generating the interpolation code in response to the shift request, wherein the interpolation code generator adjusts the interpolation code in order to control the interpolator to generate the synthesized clock having a boundary phase between first and second phase regions when the shift request represents the synthesized clock shifting from one to the other between the first and second phase regions.

The shift request may either be a multi-shift-up request or a multi-shift-down request. The multi-shift-up request may represent shifting up the synthesized clock by two or more phase steps from a current phase. The multi-shift-down request may represent shifting down the synthesized clock by two or more phase steps from the current phase.

According to embodiments of the present invention, the glitches of the phase interpolator circuit can be prevented.

BRIEF DESCRIPTION OF THE DRAWINGS

FIG. 4 is a diagram explaining values of first bits CODE<3:5> of an interpolation code CODE<0:5> and corresponding selected clocks SEL_CLK0 and SEL_CLK1.

FIG. 5 is a diagram explaining values of second bits CODE<0:2> of an interpolation code CODE<0:5> and corresponding synthesis ratios.

FIG. 6 is a diagram explaining values of an interpolation code CODE<0:5> and a corresponding output clock CLK_OUT.

DETAILED DESCRIPTION

Figure 1:
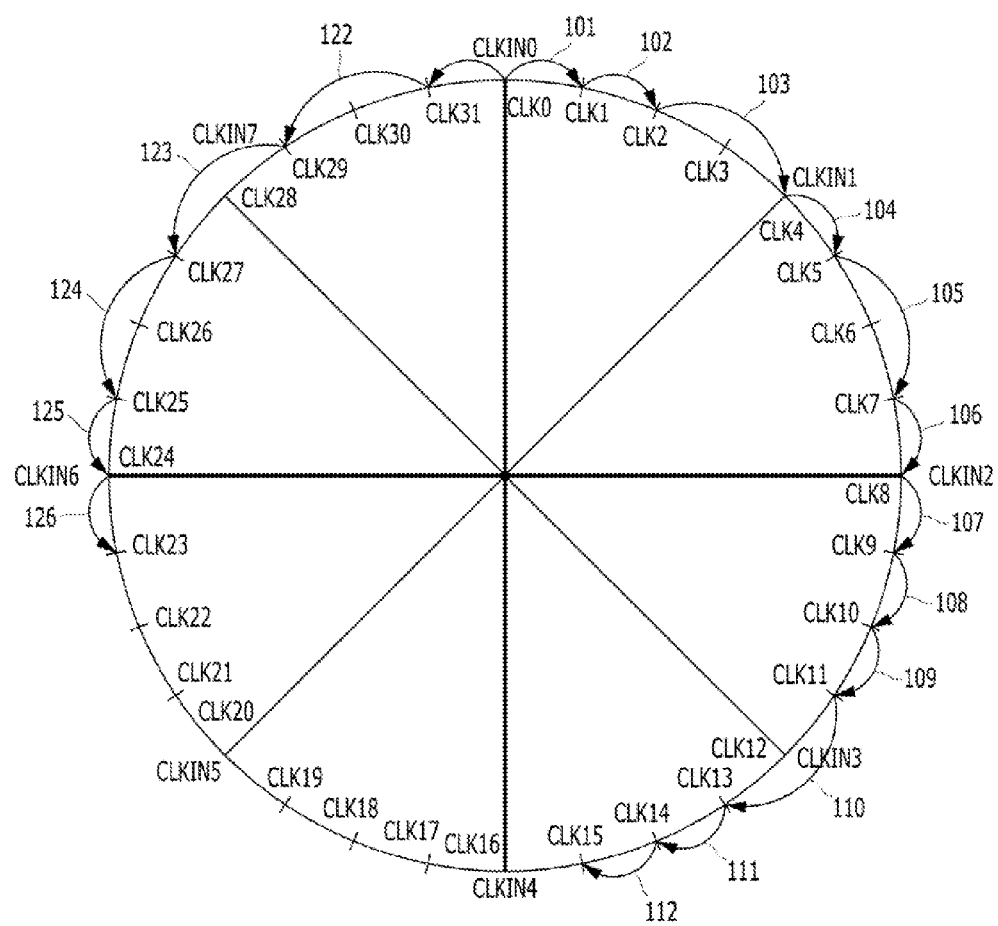
FIG. 1 is a diagram explaining where glitches occur in a phase interpolator circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram explaining glitches that occur in a phase interpolator circuit.

In FIG. 1, first to eighth multi-phase clocks CLKIN0 to CLKIN7 may be input to the phase interpolator circuit. The phase interpolator circuit may generate synthesized clocks CLK0 to CLK31 having various phases through synthesizing the multi-phase clocks CLKIN0 to CLKIN7. The synthesized clocks CLK0 to CLK31 may be output from the phase interpolator circuit.

Two of the multi-phase clocks CLKIN0 to CLKIN7 having adjacent phases may be synthesized to generate the synthesized clocks CLK0 to CLK31 having phases between the two multi-phase clocks. In this way, all of the synthesized clocks CLK0 to CLK31 may be generated from the multi-phase clocks CLKIN0 to CLKIN7. As shown in FIG. 1, the synthesized clocks CLK1, CLK2, and CLK3 may be generated by synthesizing the multi-phase clocks CLKIN0 and CLKIN1, and the synthesized clocks CLK13, CLK14, and CLK15 may be generated by synthesizing the multi-phase clocks CLKIN3 and CLKIN4. Since the synthesized clocks CLK0, CLK4, CLK8, CLK12, CLK16, CLK20, CLK24, and CLK28 have the same phase as the phase of the multi-phase clocks CLKIN0 to CLKIN7, they may be generated by outputting the multi-phase clocks CLKIN0 to CLKIN7 as they are.

In view of phase space illustrated in FIG. 1, the reference numerals 101 to 112 indicate a process in which the output clocks of the phase interpolator circuit are shifted up from the synthesized clock CLK0 to the synthesized clock CLK15. In such shift-up process, glitches occur in the phase interpolator circuit when the output clocks are shifted at a time from the synthesized clock of a phase region between the K-th multi-phase clock and the (K+1)-th multi-phase clock to the synthesized clock of another phase region between the (K+1)-th multi-phase clock and the (K+2)-th multi-phase clock. Here, K is greater than or equal to 1 and less than or equal to 8, in the case of K-th being 8th, (K+1)-th is first, and in the case of K-th being first, (K−1)-th is 8th. In short, the ordinal numerals of the multi-phase clocks may result from modulo 8 operation. This is referred to as the phase region shift. That is, the glitches may occur in the phase region shift.

Referring to the reference numeral 110 of FIG. 1, the output clocks of the phase interpolator circuit are changed at a time from the synthesized clock CLK11 of a phase region between the third multi-phase clock CLKIN2 and the fourth multi-phase clock CLKIN3 to the synthesized clock CLK13 of another phase region between the fourth multi-phase clock CLKIN3 and the fifth multi-phase clock CLKIN4, and in this case of the phase region shift, the glitches may occur in the phase interpolator circuit. The phase region shift requires synthesizing the third and fourth multi-phase clocks CLKIN2 and CLKIN3 of a phase region and then synthesizing the fourth and fifth multi-phase clocks CLKIN3 and CLKIN4 of another phase region, and thus the glitches may occur due to an abrupt change of the synthesis of the multi-phase clocks. In contrast, the glitches may not occur when the output clocks of the phase interpolator circuit are changed from the synthesized clock of a phase region between the K-th multi-phase clock and the (K+1)-th multi-phase clock to the synthesized clock of phase region boundary, that is, the (K+1)-th multi-phase clock, and then are changed to the synthesized clock of another phase region between the (K+1)-th multi-phase clock and the (K+2)-th multi-phase clock. For example, in the case of the shift up illustrated by the reference numerals 103 and 104 or in the case of the shift up illustrated by the reference numerals 106 and 107, the glitches may not occur. In summary, the glitches may occur during the phase region jump where the output clocks of the phase interpolator circuit are changed by two or more phase steps at a time from a phase region to another phase region of the multi-phase clocks.

In view of the phase space illustrated in FIG. 1, the reference numerals 121 to 126 indicate a process in which the output clocks of the phase interpolator circuit are shifted down from the synthesized clock CLK0 to the synthesized clock CLK23. In this shift-down process, glitches occur in the phase interpolator circuit when the output clocks are shifted at a time from the synthesized clock of a phase region between the K-th multi-phase clock and the (K+1)-th multi-phase clock to the synthesized clock of another phase region between the (K−1)-th multi-phase clock and the (K−2)-th multi-phase clock. This is another example of the phase region shift. Referring to the reference numeral 123 of FIG. 1, the output clocks of the phase interpolator circuit are changed at a time from the synthesized clock CLK29 of a phase region between the eighth multi-phase clock CLKIN7 and the first multi-phase clock CLKIN0 to the synthesized clock CLK27 of another phase region between the seventh multi-phase clock CLKIN6 and the eighth multi-phase clock CLKIN7, and in this case of the phase region shift, the glitches may occur in the phase interpolator circuit. The phase region shift requires synthesizing the eighth and first multi-phase clocks CLKIN7 and CLKIN0 of a phase region and then synthesizing the seventh and eighth multi-phase clocks CLKIN6 and CLKIN7 of another phase region, and thus the glitches may occur due to an abrupt change of the synthesis of the multi-phase clocks. In contrast, the glitches may not occur when the output clocks of the phase interpolator circuit are changed from the synthesized clock of a phase region between the K-th multi-phase clock and the (K+1)-th multi-phase clock to the synthesized clock of phase region boundary, that is, the K-th multi-phase clock, and then are changed to the synthesized clock of another phase region between the (K−1)-th multi-phase clock and the K-th multi-phase clock. For example, in the shift down illustrated by the reference numerals 125 and 126 of FIG. 1, glitches may not occur. In summary, the glitches may occur during the phase region jump where the output clocks of the phase interpolator circuit are changed by two or more phase steps at a time from one phase region to another phase region of the multi-phase clocks.

Figure 2:
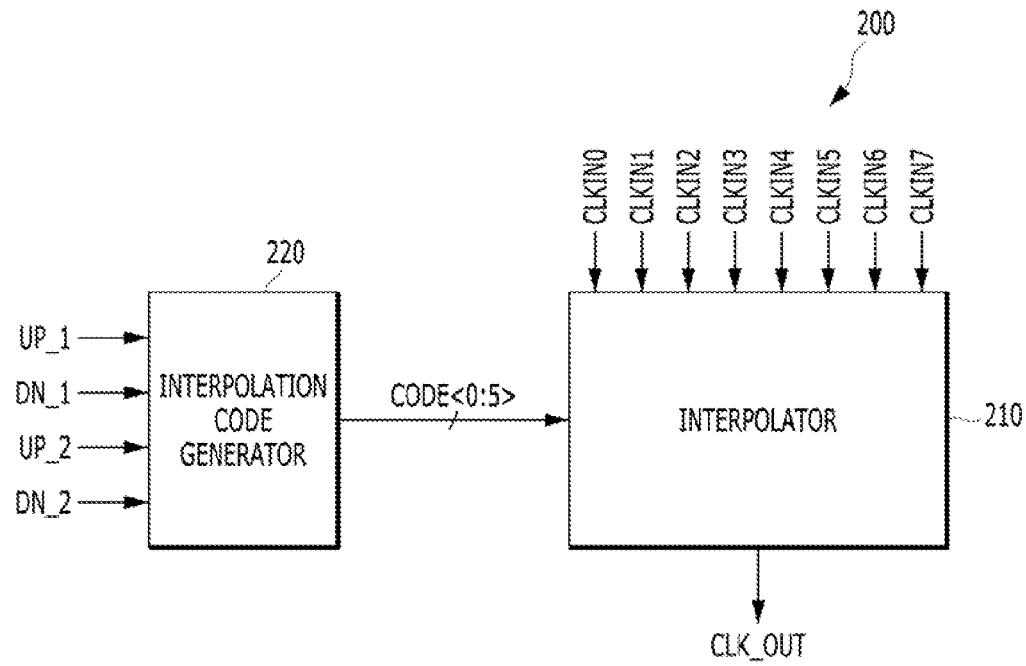
FIG. 2 is a diagram illustrating the configuration of a phase interpolator circuit 200 in accordance with an embodiment of the present invention.

FIG. 2 is a diagram illustrating the configuration of a phase interpolator circuit 200 in accordance with an embodiment of the present invention.

Referring to FIG. 2, the phase interpolator circuit 200 may include an interpolator 210 and an interpolation code generator 220.

The interpolator 210 may generate one of synthesized clocks CLK0 to CLK31 through synthesizing two multi-phase clocks that are selected from first to eighth multi-phase clocks CLKIN0 to CLKIN7 and output the generated synthesized clock as an output clock CLK_OUT. The selected two multi-phase clocks may form a single phase region. The clocks used for synthesis of two among the first to eighth multi-phase clocks CLKIN0 to CLKIN7 and the synthesis ratio thereof may be determined by an interpolation code CODE<0:5>.

The interpolation code generator 220 may generate the interpolation code CODE<0:5> in response to a shift-up request UP_1, a shift-down request DN_1, a multi-shift-up request UP_2, and a multi-shift-down request DN_2. The shift-up request UP_1 may be a request to shift up the phase of the output clock CLK_OUT by one step. For example, when the current output clock CLK_OUT is the synthesized clock CLK1, the shift-up request UP_1 may be a request to change the output clock CLK_OUT to the synthesized clock CLK2. The shift-down request DN_1 may be a request to shift down the phase of the output clock CLK_OUT by one step. For example, when the current output clock CLK_OUT is the synthesized clock CLK1, the shift-down request DN_1 may be a request to change the output clock CLK_OUT to the synthesized clock CLK0. The multi-shift-up request UP_2 may be a request to shift up the phase of the output clock CLK_OUT by two steps. For example, when the current output clock CLK_OUT is the synthesized clock CLK1, the multi-shift-up request UP_2 may be a request to change the output clock CLK_OUT to the synthesized clock CLK3. The multi-shift-down request DN_2 may be a request to shift down the phase of the output clock CLK_OUT by two steps. For example, when the current output clock CLK_OUT is the synthesized clock CLK3, the multi-shift-down request DN_2 may be a request to change the output clock CLK_OUT to the synthesized clock CLK1.

When the shift-up request UP_1 is enabled, the interpolation code generator 220 may change the interpolation code CODE<0:5> so that the output clock CLK_OUT is to be shifted up by one step. Further, when the shift-down request DN_1 is enabled, the interpolation code generator 220 may change the interpolation code CODE<0:5> so that the output clock CLK_OUT is to be shifted down by one step.

When the multi-shift-up request UP_2 is enabled, the interpolation code generator 220 may change the interpolation code CODE<0:5> so that the output clock CLK_OUT is to be shifted up by two steps. However, when there is a possibility that glitches occur in the output clock CLK_OUT due to the two-step shift up of the output clock CLK_OUT, i.e., when the phase region shift occurs due to the two-step shift up, the interpolation code generator 220 may change the interpolation code CODE<0:5> so that the output clock CLK_OUT is to be shifted up not by two steps but by a single step. Further, when the multi-shift-down request DN_2 is enabled, the interpolation code generator 220 may change the interpolation code CODE<0:5> so that the output clock CLK_OUT is to be shifted down by two steps. However, when there is a possibility that glitches occur in the output clock CLK_OUT due to the two-step shift down of the output clock CLK_OUT, i.e., when the phase region shift occurs due to the two-step shift down, the interpolation code generator 220 may change the interpolation code CODE<0:5> so that the output clock CLK_OUT is to be shifted down not by two steps but by a single step. In summary, when there is a possibility of glitches or when the phase region shift occurs in response to the multi-shift-up request UP_2 or the multi-shift-down request DN_2, the interpolation code generator 220 may prevent glitches by reducing the shift step.

FIG. 2 exemplarily illustrates 8 multi-phase clocks CLKIN0 to CLKIN7 that are input to the interpolator 210, which will not be limited thereto. Further, in FIG. 2, it is exemplified that the phase is shifted up by two steps by the multi-shift-up request UP_2 and the phase is shifted down by two steps by the multi-shift-down request DN_2. However, the phase may be shifted up by more than two steps by the multi-shift-up request and the phase may be shifted down by more than two steps by the multi-shift-down request.

Figure 3:
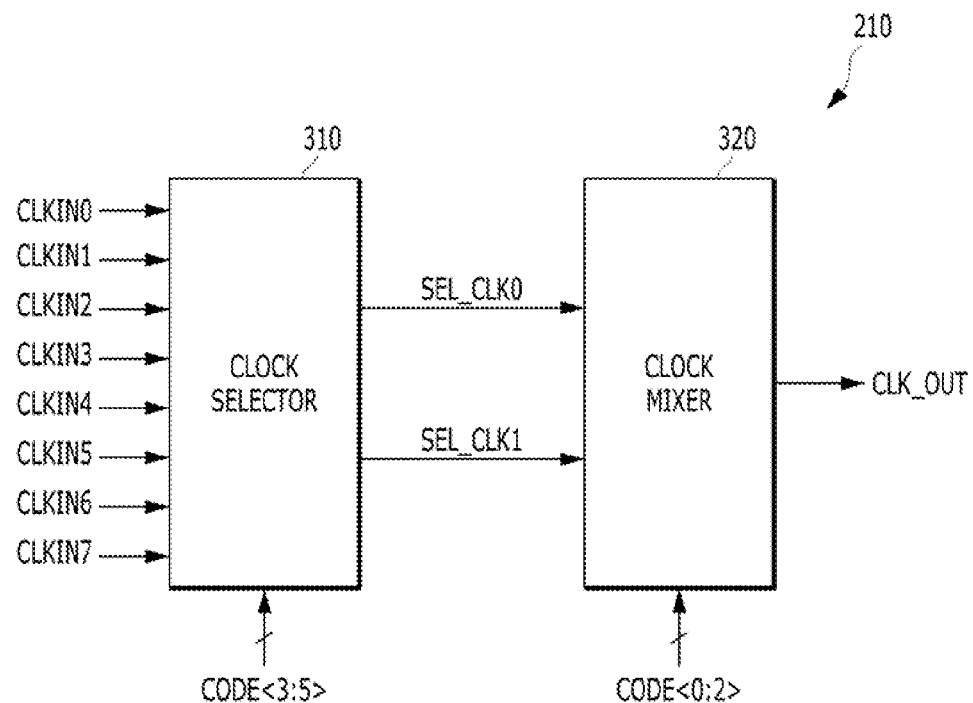
FIG. 3 is a diagram illustrating the configuration of an interpolator 210 of FIG. 2.

FIG. 3 is a diagram illustrating the configuration of the interpolator 210 of FIG. 2.

Referring to FIG. 3, the interpolator 210 may include a clock selector 310 and a clock mixer 320.

The clock selector 310 may select two multi-phase clocks from the first to eighth multi-phase clocks CLKIN0 to CLKIN7 in response to first bits CODE<3:5> of the interpolation code CODE<0:5>, and output the selected clocks EL_CLK0 and SEL_CLK1. FIG. 4 exemplarily illustrates values of the first bits CODE<3:5> of the interpolation code CODE<0:5> and corresponding selected clocks SEL_CLK0 and SEL_CLK1.

The clock mixer 320 may generate the output clock CLK_OUT through synthesizing the clocks SEL_CLK0 and SEL_CLK1 that are selected by the clock selector 310. The synthesis ratio at which the clock mixer 320 synthesizes the selected clocks SEL_CLK0 and SEL_CLK1 may be one of 4:0, 3:1, 2:2, 1:3, and 0:4. The synthesis ratio may be determined by the second bits CODE<0:2> of the interpolation code CODE<0:5>. When the synthesis ratio is 4:0, the output clock CLK_OUT may be equal to the selected clock SEL_CLK0. When the synthesis ratio is 3:1, the output clock CLK_OUT has a phase that is closer to the selected clock SEL_CLK0 between the selected clock SEL_CLK0 and the selected clock SEL_CLK1. When the synthesis ratio is 2:2, the output clock CLK_OUT has a phase in the middle of the selected clock SEL_CLK0 and the selected clock SEL_CLK1. When the synthesis ratio is 1:3, the output clock CLK_OUT has a phase that is closer to the selected clock SEL_CLK1 between the selected clock SEL_CLK0 and the selected clock SEL_CLK1. When the synthesis ratio is 0:4, the output clock CLK_OUT may be equal to the selected clock SEL_CLK1. FIG. 5 exemplarily illustrates values of second bits CODE<0:2> of an interpolation code CODE<0:5> and corresponding synthesis ratios.

FIG. 6 is a diagram explaining values of an interpolation code CODE<0:5> and a corresponding output clock CLK_OUT. When the output clock CLK_OUT has the same phase as the synthesized clocks CLK0, CLK4, CLK8, CLK12, CLK16, CLK20, CLK24, and CLK28, it corresponds to two code values. One of the two code values may be used, or the two code values may be appropriately used depending on the circumstances.

Figure 7:
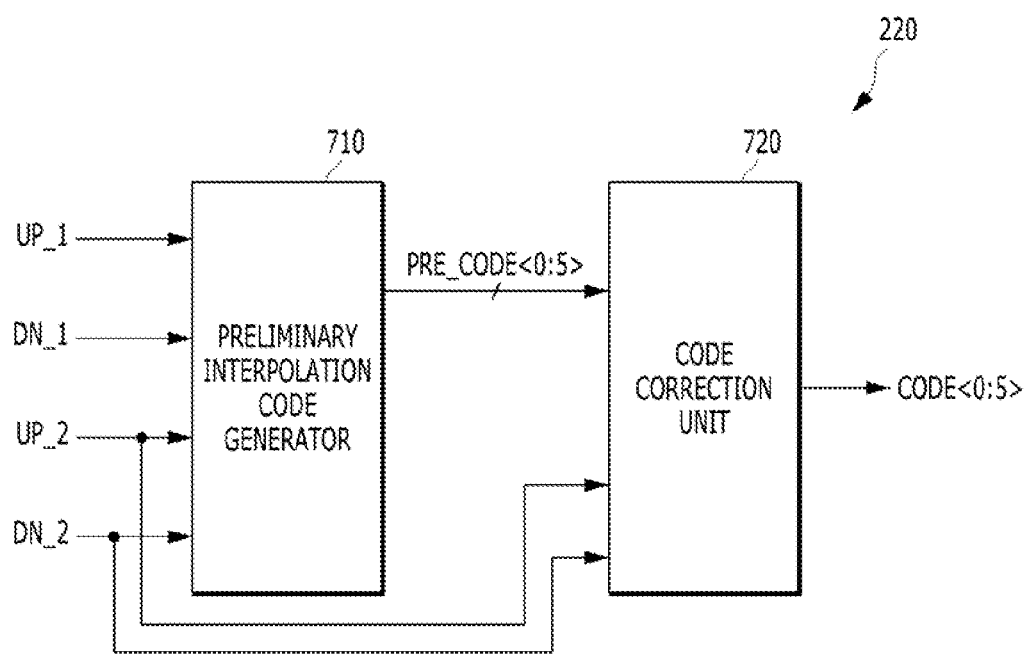
FIG. 7 is a diagram illustrating the configuration of an interpolation code generator 220 of FIG. 2.

FIG. 7 is a diagram illustrating the configuration of the interpolation code generator 220 of FIG. 2.

Referring to FIG. 7, the interpolation code generator 220 may include a preliminary interpolation code generator 710 and a code correction unit 720. The preliminary interpolation code generator 710 may generate a preliminary interpolation code PRE_CODE<0:5> in response to a shift-up request UP_1, a shift-down request DN_1, a multi-shift-up request UP_2, and a multi-shift-down request DN_2. When the shift-up request UP_1 is enabled, the preliminary interpolation code generator 710 may shift up the preliminary interpolation code PRE_CODE<0:5> by one step, and when the shift-down request DN_1 is enabled, the preliminary interpolation code generator 710 may shift down the preliminary interpolation code PRE_CODE<0:5> by one step. When the multi-shift-up request UP_2 is enabled, the preliminary interpolation code generator 710 may shift up the preliminary interpolation code PRE_CODE<0:5> by two steps, and when the multi-shift-down request DN_2 is enabled, the preliminary interpolation code generator 710 may shift down the preliminary interpolation code PRE_CODE<0:5> by two steps. That is, the code values of the preliminary interpolation code PRE_CODE<0:5> may be directly reflect the shift-up request UP_1, the shift-down request DN_1, the multi-shift-up request UP_2, and the multi-shift-down request DN_2.

The code correction unit 720 may generate the interpolation code CODE<0:5> using the preliminary interpolation code PRE_CODE<0:5>. The code correction unit 720 may generate the interpolation code CODE<0:5> that is basically the same as the preliminary interpolation code PRE_CODE<0:5>. However, when there is a possibility of the glitches when the preliminary interpolation code PRE_CODE<0:5> is to be directly used as the interpolation code CODE<0:5>, or when the phase region shift is to occur due to the interpolation code CODE<0:5>, which is the same as the preliminary interpolation code PRE_CODE<0:5>, the code correction unit 720 may generate the interpolation code CODE<0:5> through correcting the preliminary interpolation code PRE_CODE<0:5>.

The code correction unit 720 may generate the interpolation code CODE<0:5> through correcting the preliminary interpolation code PRE_CODE<0:5> in two ways as follows.

(1) When there is a possibility of the glitches in the case where the preliminary interpolation code PRE_CODE<0:5> is shifted up by two steps by the multi-shift-up request UP_2 and the preliminary interpolation code PRE_CODE<0:5> is directly used as the interpolation code CODE<0:5>, or when the phase region shift is to occur due to the interpolation code CODE<0:5>, which is the same as the preliminary interpolation code PRE_CODE<0:5>, i.e., when it is required to change the output clock CLK_OUT from a phase region between the K-th and (K+1)-th multi-phase clocks to another phase between the (K+1)-th and (K+2)-th multi-phase clocks in accordance with the preliminary interpolation code PRE_CODE<0:5>, the code correction unit 720 may generate the interpolation code CODE<0:5> through shifting down the preliminary interpolation code PRE_CODE<0:5> by one step.

(2) When there is a possibility of the glitches in the case where the preliminary interpolation code PRE_CODE<0:5> is shifted down by two steps by the multi-shift-down request DN_2 and the preliminary interpolation code PRE_CODE<0:5> is directly used as the interpolation code CODE<0:5>, or when the phase region shift is to occur due to the interpolation code CODE<0:5>, which is the same as the preliminary interpolation code PRE_CODE<0:5>, i.e., when it is required to change the output clock CLK_OUT from a phase region between the K-th and (K+1)-th multi-phase clocks to another phase region between the (K−1)-th and K-th multi-phase clocks in accordance with the preliminary interpolation code PRE_CODE<0:5>, the code correction unit 720 may generate the interpolation code CODE<0:5> through shifting up the preliminary interpolation code PRE_CODE<0:5> by one step.

Figure 8:
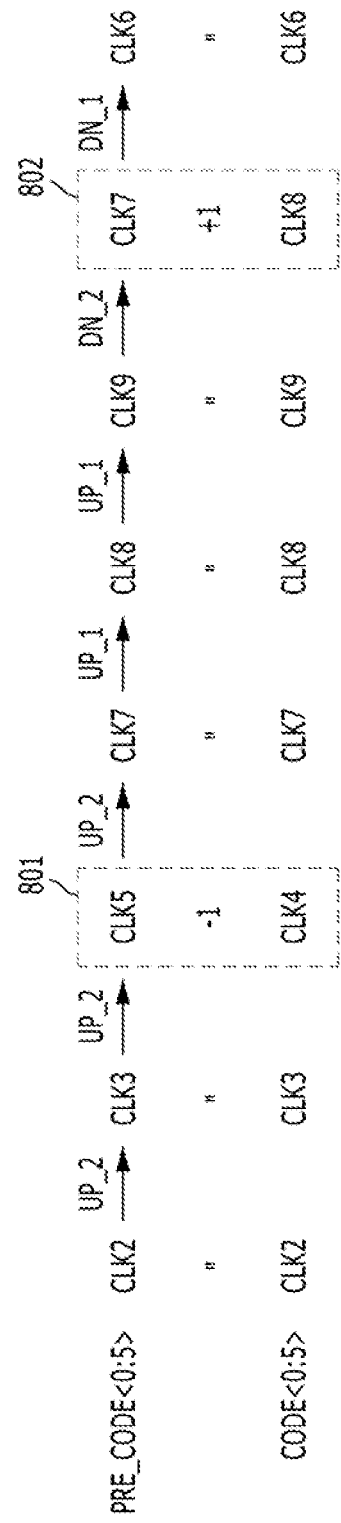
FIG. 8 is a diagram explaining a preliminary interpolation code PRE_CODE<0:5> and an interpolation code CODE<0:5> that are changed by a shift-up request UP_1, a shift-down request DN_1, a multi-shift-up request UP_2, and a multi-shift-down request DN_2.

FIG. 8 is an exemplary diagram explaining a preliminary interpolation code PRE_CODE<0:5> and an interpolation code CODE<0:5> that are changed by a shift-up request UP_1, a shift-down request DN_1, a multi-shift-up request UP_2, and a multi-shift-down request DN_2. Referring to FIG. 8, the interpolation code CODE<0:5> may be generated differently from the preliminary interpolation code PRE_CODE<0:5> in a section 801 where there is a possibility of the glitches or where the phase region shift is to occur due to the preliminary interpolation code PRE_CODE<0:5> by the multi-shift-up request UP_2. Also, the interpolation code CODE<0:5> may be generated differently from the preliminary interpolation code PRE_CODE<0:5> in a section 802 where there is a possibility of the glitches or where the phase region shift is to occur due to the preliminary interpolation code PRE_CODE<0:5> by the multi-shift-down request DN_2.

Figure 9:
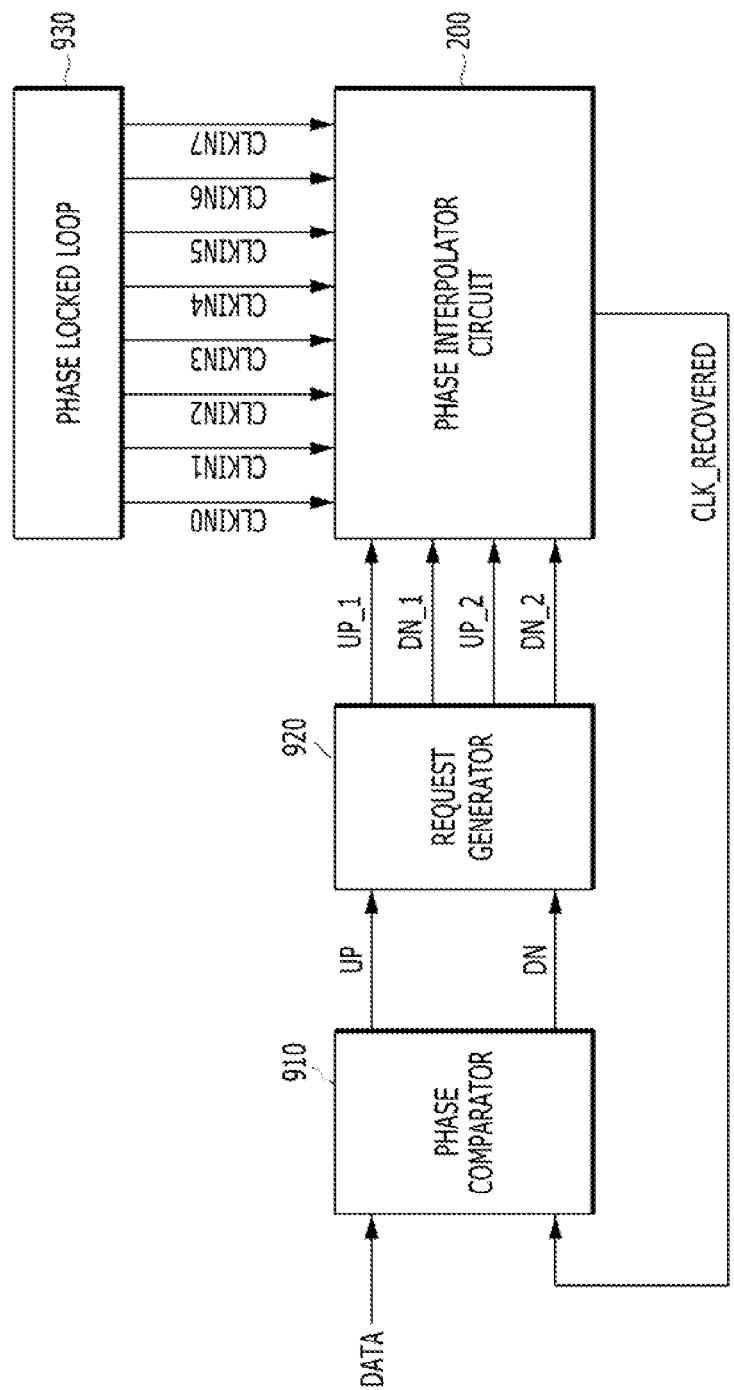
FIG. 9 is a diagram illustrating the configuration of a clock data recovery circuit in accordance with an embodiment of the present invention.

FIG. 9 is a diagram illustrating the configuration of a clock data recovery circuit in accordance with an embodiment of the present invention. Here, it is exemplified that the phase interpolator circuit 200 is applied to the clock data recovery circuit that generates a recovered clock CLK_RECOVERED that is synchronized with received data DATA.

Referring to FIG. 9, the clock data recovery circuit may include a phase comparator 910, a request generator 920, a phase locked loop 930, and a phase interpolator circuit 200.

The phase comparator 910 may compare phases of the received data DATA and the recovered clock CLK_RECOVERED, and generate an up signal UP and a down signal DN that indicate relative phases of the received data DATA and the recovered clock CLK_RECOVERED.

The request generator 920 may enable the shift-up request UP_1 or the multi-shift-up request UP_2 when it is determined to increase the phase of the recovered clock CLK_RECOVERED, and enable the shift-down request DN-1 and the multi-shift-down request DN_2 when it is determined to decrease the phase of the recovered clock CLK_RECOVERED, using the comparison results UP and DOWN of the phase comparator 910. Whether to shift up or down the recovered clock CLK_RECOVERED by one step or by two steps may be determined in accordance with a predetermined algorithm of the request generator 920.

The phase locked loop 930 may generate the first to eighth multi-phase clocks CLKIN0 to CLKIN7 that are input to the phase interpolator circuit 200.

The phase interpolator circuit 200 may generate the recovered clock CLK_RECOVERED using the first to eighth multi-phase clocks CLKIN0 to CLKIN7. The phase interpolator circuit 200 may shift up or down the phase of the recovered clock CLK_RECOVERED in response to the shift-up request UP_1, the shift-down request DN_1, the multi-shift-up request UP_2, and the multi-shift-down request DN_2. The configuration and the operation of the phase interpolator circuit 200 may be the same as those described above with reference to FIGS. 2 to 8. In FIG. 9, it is exemplified that the phase interpolator circuit 200 is applied to the clock data recovery circuit, and thus the output clock CLK_OUT of the phase interpolator circuit 200, which is described with reference to FIGS. 2 to 8, is indicated as the recovered clock CLK_RECOVERED.

Since the recovered clock CLK_RECOVERED that is generated by the phase interpolator circuit 200 is accurately aligned to the center of the received data DATA, the received data DATA can be accurately sampled using the recovered clock CLK_RECOVERED.

Although various embodiments have been described for illustrative purposes, it will be apparent to those skilled in the art that various changes and modifications may be made without departing from the spirit and scope of the invention as defined in the following claims.

What is claimed is:

1. A phase interpolator circuit comprising:
   an interpolator suitable for generating synthesized clocks through synthesizing two multi-phase clocks that are selected from first to N-th multi-phase clocks, wherein N is an integer greater than or equal to 3; and
   an interpolation code generator suitable for generating an interpolation code for controlling the interpolator in response to a shift-up request, a shift-down request, a multi-shift-up request, and a multi-shift-down request,
   wherein the interpolation code generator generates the interpolation code so that a (K+1)-th multi-phase clock is output as the synthesized clock when a phase of the synthesized clock should be changed from a phase between K-th and (K+1)-th multi-phase clocks to a phase between (K+1)-th and (K+2)-th multi-phase clocks in response to the multi-shift-up request, wherein K is an integer greater than or equal to 1 and less than or equal to N, in the case of K-th being N-th, (K+1)-th is first, and in the case of K-th being first, (K−1)-th is N-th.

2. The phase interpolator circuit of claim 1, wherein the interpolation code generator further generates the interpolation code so that the K-th multi-phase clock is output as the synthesized clock when the phase of the synthesized clock should be changed from the phase between the K-th and (K+1)-th multi-phase clocks to a phase between (K−1)-th and K-th multi-phase clocks in response to the multi-shift-down request.

3. The phase interpolator circuit of claim 2, wherein the interpolator comprises:
   a clock selector suitable for selecting the two multi-phase clocks from the first to N-th multi-phase clocks in response to first bits of the interpolation code; and
   a clock mixer suitable for generating the synthesized clocks through synthesizing the two multi-phase clocks that are selected by the clock selector at a synthesis ratio that is determined by second bits of the interpolation code.

4. The phase interpolator circuit of claim 3, wherein the interpolation code generator comprises:
- a preliminary interpolation code generator suitable for increasing by one step a preliminary interpolation code in response to the shift-up request, for increasing by two steps the preliminary interpolation code in response to the multi-shift-up request, for decreasing by one step the preliminary interpolation code in response to the shift-down request, and for decreasing by two steps the preliminary interpolation code in response to the multi-shift-down request; and
- a code corrector which:
- decrease by one step the preliminary interpolation code and output the decreased preliminary interpolation code as the interpolation code when the phase of the synthesized clock changes from the phase between the K-th and (K+1)-th multi-phase clocks to the phase between the (K+1)-th and (K+2)-th multi-phase clocks in response to the multi-shift-up request,
- increase by one step the preliminary interpolation code and output the increased preliminary interpolation code as the interpolation code when the phase of the synthesized clock should be changed from the phase between the K-th and (K+1)-th multi-phase clocks to the phase between (K−1)-th and K-th multi-phase clocks in response to the multi-shift-down request, and
- output the preliminary interpolation code as the interpolation code otherwise.

5. A phase interpolation method comprising:
- selecting two multi-phase clocks from first to N-th multi-phase clocks in response to first bits of an interpolation code, wherein N is an integer greater than or equal to 3;
- generating synthesized clocks through synthesizing the two multi-phase clocks at a synthesis ratio that is determined by second bits of the interpolation code;
- increasing by one step a preliminary interpolation code in response to a shift-up request;
- generating the interpolation code so that the interpolation code has the same value as the preliminary interpolation code when the preliminary interpolation code is increased by one step;
- increasing by two steps the preliminary interpolation code in response to a multi-shift-up request; and
- generating the interpolation code by decreasing by one step the preliminary interpolation code when the preliminary interpolation code is increased by two steps and a phase of the synthesized clock is changed from a phase between K-th and (K+1)-th multi-phase clocks to a phase between (K+1)-th and (K+2)-th multi-phase clocks, wherein K is an integer that is greater than or equal to 1 and less than or equal to N, in the case of K-th being N-th, (K+1)-th is first, and in the case of K-th being first, (K−1)-th is N-th, and generating the interpolation code so that the interpolation code has the same value as the preliminary interpolation code otherwise.

6. The phase interpolation method of claim 5, further comprising:
- decreasing by one step the preliminary interpolation code in response to a shift-down request;
- generating the interpolation code in the same manner as the preliminary interpolation code when the preliminary interpolation code is decreased by one step;
- decreasing by two steps the preliminary interpolation code in response to a multi-shift-down request; and
- generating the interpolation code by increasing by one step the preliminary interpolation code when the preliminary interpolation code is decreased by two steps, and the phase of the synthesized clock is changed from the phase between the K-th and (K+1)-th multi-phase clocks to a phase between (K−1)-th and K-th multi-phase clocks, and generating the interpolation code in the same manner as the preliminary interpolation code otherwise.

7. A clock data recovery circuit comprising:
- a phase comparator suitable for comparing phases of received data and a recovered clock;
- a request generator suitable for generating a shift-up request, a multi-shift-up request, a shift-down request, and a multi-shift-down request in response to the comparison result of the phase comparator;
- an interpolator suitable for generating synthesized clocks through synthesizing two multi-phase clocks that are selected from first to N-th multi-phase clocks, wherein N is an integer greater than or equal to 3; and
- an interpolation code generator suitable for generating an interpolation code for controlling the interpolator in response to the shift-up request, the shift-down request, the multi-shift-up request, and the multi-shift-down request,
- wherein the interpolation code generator generates the interpolation code so that the (K+1)-th multi-phase clock is output as the synthesized clock when a phase of the synthesized clock should be changed from a phase between K-th and (K+1)-th multi-phase clocks to a phase between (K+1)-th and (K+2)-th multi-phase clocks in response to the multi-shift-up request, wherein K is an integer greater than or equal to 1 and less than or equal to N, in the case of K-th being N-th, (K+1)-th is first, and in the case of K-th being first, (K−1)-th is N-th.

8. The clock data recovery circuit of claim 7, wherein the interpolation code generator further generates the interpolation code so that the K-th multi-phase clock is output as the synthesized clock when the phase of the synthesized clock should be changed from the phase between the K-th and (K+1)-th multi-phase clocks to a phase between (K−1)-th and K-th multi-phase clocks in response to the multi-shift-down request.

9. The clock data recovery circuit of claim 8, wherein the interpolator comprises:
- a clock selector suitable for selecting the two multi-phase clocks from the first to N-th multi-phase clocks in response to first bits of the interpolation code; and
- a clock mixer suitable for generating the synthesized clocks through synthesizing the two multi-phase clocks that are selected by the clock selector at a synthesis ratio that is determined by second bits of the interpolation code.

10. The clock data recovery circuit of claim 9, wherein the interpolation code generator comprises:
- a preliminary interpolation code generator suitable for increasing by one step a preliminary interpolation code in response to the shift-up request, for increasing by two steps the preliminary interpolation code in response to the multi-shift-up request, for decreasing by one step the preliminary interpolation code in response to the shift-down request, and for decreasing by two steps the preliminary interpolation code in response to the multi-shift-down request; and
- a code corrector which:
- decreases by one step the preliminary interpolation code and outputs the decreased preliminary interpolation code as the interpolation code when the phase of the synthesized clock should be changed from the phase between the K-th and (K+1)-th multi-phase clocks to the phase between the (K+1)-th and (K+2)-th multi-phase clocks in response to the multi-shift-up request, increases by one step the preliminary interpolation code and outputs the increased preliminary interpolation code as the interpolation code when the phase of the synthesized clock should be changed from the phase between the K-th and (K+1)-th multi-phase clocks to the phase between (K−1)-th and K-th multi-phase clocks in response to the multi-shift-down request, and outputs the preliminary interpolation code as the interpolation code otherwise.

11. The clock data recovery circuit of claim 9, further comprising a phase locked loop suitable for generating the first to N-th multi-phase clocks.

12. A phase interpolator circuit comprising:

an interpolator suitable for generating a synthesized clock by synthesizing two selected from plural multi-phase clocks according to an interpolation code, wherein the selected multi-phase clocks form a phase region; and an interpolation code generator suitable for generating the interpolation code in response to a shift request, wherein the interpolation code generator adjusts the interpolation code in order to control the interpolator to generate the synthesized clock having a boundary phase between first and second phase regions when the shift request represents the synthesized clock shifting from one to the other between the first and second phase regions, wherein the shift request is either a multi-shift-up request or a multi-shift-down request, wherein the multi-shift-up request represents shifting up the synthesized clock by two or more phase steps from a current phase, and wherein the multi-shift-down request represents shifting down the synthesized clock by two or more phase steps from the current phase.

13. The phase interpolator circuit of claim 12, wherein the interpolation code generator comprises:

a preliminary interpolation code generator suitable for generating the interpolation code in response to the shift request; and a code corrector which adjusts the interpolation code to represent shifting up or down the synthesized clock by a single phase step from a current phase when the shift request represent the synthesized clock shifting from one to the other between the first and second phase regions.

14. The phase interpolator circuit of claim 12, wherein the interpolator comprises:

a clock selector suitable for selecting the two multi-phase clocks according to first bits of the interpolation code; and a clock mixer suitable for generating the synthesized clocks by synthesizing the two multi-phase clocks at a synthesis ratio defined by second bits of the interpolation code.

15. A clock data recovery circuit comprising:

a phase comparator suitable for comparing phases of received data and a recovered clock;

a request generator suitable for generating a shift request according to the comparison result;

an interpolator suitable for generating a synthesized clock by synthesizing two selected from plural multi-phase clocks according to an interpolation code, wherein the selected multi-phase clocks form a phase region; and an interpolation code generator suitable for generating the interpolation code in response to the shift request, wherein the interpolation code generator adjusts the interpolation code in order to control the interpolator to generate the synthesized clock having a boundary phase between first and second phase regions when the shift request represent the synthesized clock shifting from one to the other between the first and second phase regions, wherein the shift request is either a multi-shift-up request or a multi-shift-down request, wherein the multi-shift-up request represents shifting up the synthesized clock by two or more phase steps from a current phase, and wherein the multi-shift-down request represents shifting down the synthesized clock by two or more phase steps from the current phase.

16. The clock data recovery circuit of claim 15, wherein the interpolation code generator comprises:

a preliminary interpolation code generator suitable for generating the interpolation code in response to the shift request; and a code corrector which adjusts the interpolation code to represent shifting up or down the synthesized clock by a single phase step from a current phase when the shift request represents the synthesized clock shifting from one to the other between the first and second phase regions.

17. The clock data recovery circuit of claim 15, wherein the interpolator comprises:

a clock selector suitable for selecting the two multi-phase clocks according to first bits of the interpolation code; and a clock mixer suitable for generating the synthesized clocks by synthesizing the two multi-phase clocks at a synthesis ratio defined by second bits of the interpolation code.

* * * * *